(12) United States Patent
Paul et al.

(10) Patent No.: US 11,152,356 B2
(45) Date of Patent: Oct. 19, 2021

(54) METHOD OF FORMING A SEMICONDUCTOR DEVICE AND STRUCTURE THEREFOR

(71) Applicant: SEMICONDUCTOR COMPONENTS INDUSTRIES, LLC, Phoenix, AZ (US)

(72) Inventors: Amit Paul, Sunnyvale, CA (US); Arash Elhami Khorasani, Phoenix, AZ (US); Mark Griswold, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/446,923

(22) Filed: Jun. 20, 2019

(65) Prior Publication Data

US 2020/0266191 A1 Aug. 20, 2020

Related U.S. Application Data

(60) Provisional application No. 62/807,283, filed on Feb. 19, 2019.

(51) Int. Cl.
*H01L 29/41* (2006.01)
*H01L 27/06* (2006.01)
(Continued)

(52) U.S. Cl.
CPC ...... *H01L 27/0676* (2013.01); *H01L 21/8232* (2013.01); *H01L 21/823418* (2013.01); *H01L 27/0629* (2013.01)

(58) Field of Classification Search
CPC ......... H01L 27/0676; H01L 21/823418; H01L 21/8232; H01L 27/06; H01L 21/822; H01L 29/0063; H01L 23/5227; H01L 27/0802; H01L 29/42368; H01L 29/7816; H01L 28/10; H01L 29/1095; H01L 29/7817; H01L 28/20; H01L 2924/0002; H01L 29/405; H01L 29/7835; H01L 27/0629; H01L 29/0692; H01L 29/0696; H01L 29/404; H01L 23/5228; H01L 29/063;
(Continued)

(56) References Cited

U.S. PATENT DOCUMENTS 6,680,515 B1 1/2004 Hsing
8,624,322 B1 * 1/2014 Su ...................... H01L 27/0629
257/359

(Continued)

FOREIGN PATENT DOCUMENTS

JP 2011049469 A * 3/2011 ......... G02B 6/02323

*Primary Examiner* — Samuel Park
(74) *Attorney, Agent, or Firm* — Robert F. Hightower (57) ABSTRACT

In an embodiment, a semiconductor device includes a resistor that overlies a doped region of the semiconductor device. The resistor is formed as an elongated element that is formed into a pattern of a spiral. An embodiment of the pattern of the resistor includes a plurality of revolutions from the starting point to an ending point. The resistor material has one of a separation distance between adjacent revolutions that increases with distance along a periphery of the resistor material or a width of the resistor material that increases with distance along the periphery of the resistor material.

11 Claims, 7 Drawing Sheets

(51) Int. Cl.
*H01L 21/8234* (2006.01)
*H01L 21/8232* (2006.01)

(58) Field of Classification Search
CPC ............... H01L 29/402; H01L 29/8605; H01L 27/0288; H01L 29/808
See application file for complete search history.

(56) References Cited

U.S. PATENT DOCUMENTS

| | | | |
|---|---|---|---|
| 8,786,397 B1 * | 7/2014 | Li | H01C 3/14 338/295 |
| 2006/0163691 A1 | 7/2006 | Hall et al. | |
| 2010/0022064 A1 | 1/2010 | Hall et al. | |
| 2010/0124793 A1 * | 5/2010 | Hall | H03K 17/102 438/17 |
| 2013/0032862 A1 | 2/2013 | Su et al. | |
| 2013/0070429 A1 * | 3/2013 | Depetro | H01L 29/7818 361/748 |
| 2016/0260704 A1 | 9/2016 | Huo et al. | |
| 2017/0040688 A1 * | 2/2017 | Peralta | H01Q 1/526 |

\* cited by examiner

METHOD OF FORMING A SEMICONDUCTOR DEVICE AND STRUCTURE THEREFOR

CROSS-REFERENCE TO RELATED APPLICATIONS

This application claims the benefit of U.S. provisional patent application No. 62/807,283, filed on Feb. 19, 2019, the entire contents of which are incorporated herein by reference.

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form high-voltage resistors that could be utilized to form a signal that is representative of a received high-voltage signal. In some applications the high voltage could be in excess of seven hundred to eight hundred (700 to 800) volts. In some embodiments, the resistor was formed to overlie portions of a semiconductor device to assist in forming the representative signal. Examples of some resistors can be found in U.S. Pat. Nos. 7,306,999 B2 and 7,955,943 B2 which are both incorporated herein by reference.

In some applications, the resistor had to have very large resistance value which often required forming the underlying semiconductor device to be very large. This often resulted in increased cost.

In some cases, the resistor also may have caused high electric field gradients or alternately high thermal gradients and/or hot spots in portions of the semiconductor device. The high electric field gradients and high thermal gradients often resulted in reduced performance of the device.

Accordingly, it is desirable to have a resistor that does not increase the size and/or cost of the semiconductor device, and/or that reduces electric field gradients and/or that reduces hotspots in the semiconductor device.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

The embodiments illustrated and described hereinafter suitably may have embodiments and/or may be practiced in the absence of any element which is not specifically disclosed herein.

DETAILED DESCRIPTION OF THE DRAWINGS

Figure 1:
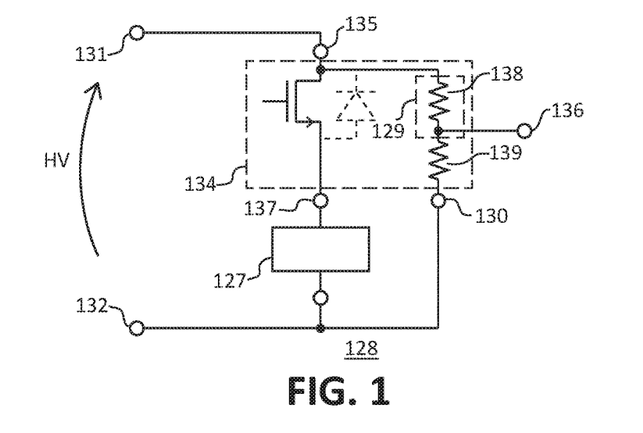
FIG. 1 schematically illustrates an example of a portion of an embodiment of a high-voltage circuit that includes a semiconductor device in accordance with the present invention.

FIG. 1 schematically illustrates an example of a portion of an embodiment of a high-voltage circuit 128 that includes a semiconductor device 134 having a high-voltage resistor 129. Circuit 128 receives a high voltage (HV) between an input terminal 131 and a common return terminal 132. The high voltage (HV) may be either an alternating DC voltage (such as a rectified AC voltage), or a DC voltage, or other type of high-voltage.

Device 134 includes an input terminal 135 that receives the high voltage, an output terminal 137, a signal output 136, and a reference terminal 130. Device 134 usually includes an active element such as for example a transistor or alternately a diode (illustrated in dashed outline), and a high-voltage resistor 129. In an embodiment, high-voltage resistor 129 may be formed as a resistor divider that includes a first resistor element 138 connected in series with a second resistor element 139 and with output 136 formed at a common node between elements 138 and 139. In other embodiments, element 139 and/or terminal 130 may be omitted.

Circuit 128 may also include other circuit elements that are connected to device 134 such as for example a circuit 127 connected between terminal 137 and return terminal 132. In some embodiments, circuit 127 may be omitted and terminal 137 may be connected to terminal 132.

Figure 2:
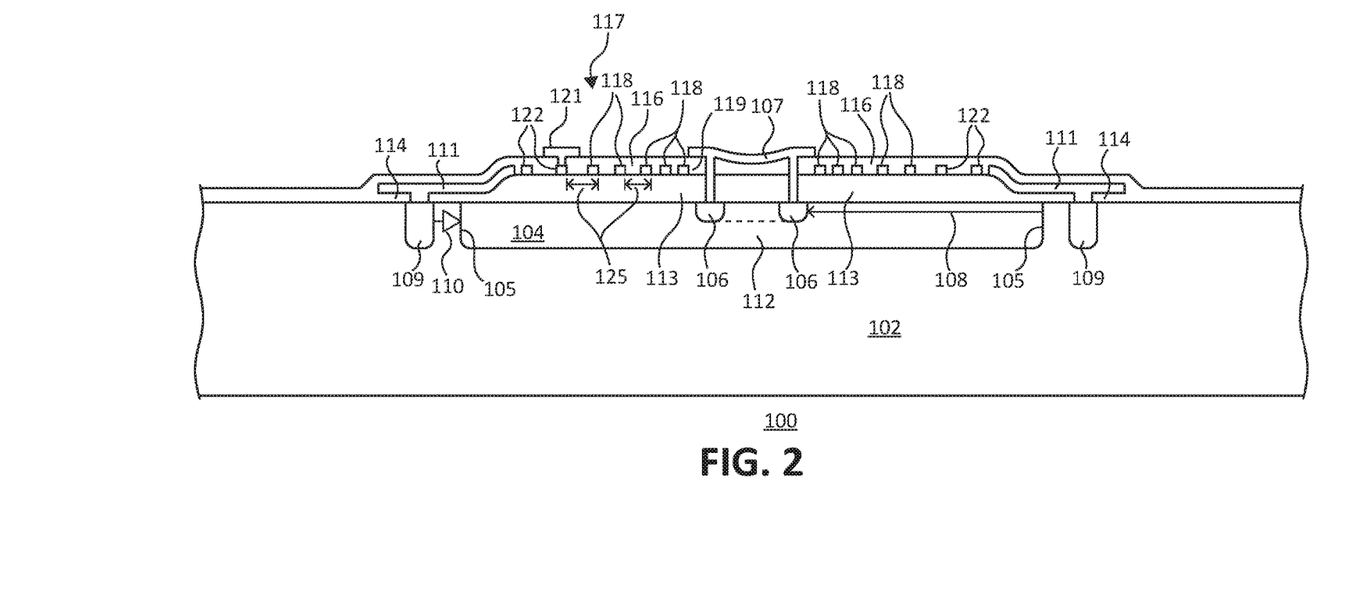
FIG. 2 illustrates an example of an enlarged cross-sectional portion of an embodiment of a semiconductor device that may be an alternate embodiment of the device of FIG. 1 in accordance with the present invention.

FIG. 2 illustrates an example of an enlarged cross-sectional portion of an embodiment of a semiconductor device 100 that may have an embodiment that may be an alternate embodiment of device 134 illustrated in FIG. 1. An embodiment of device 100 may include a diode 110 and a high-voltage resistor 117 that may be alternate embodiments of the diode of FIG. 1 and resistor 129, respectively.

Device 100 is formed on a semiconductor substrate 102. In some embodiments, substrate 102 may include a bulk semiconductor substrate that has one or more layers formed thereon. Such layers may be formed by one or more means such as for example by an epitaxial process or by other well known means. Device 100 also includes a doped region 104 that is formed on substrate 102. For example, region 104 may extend into substrate 102. An embodiment may include that substrate 102 and region 104 are formed with opposite conductivity types. For example, substrate 102 may be P-type semiconductor material and region 104 may be N-type semiconductor material. Device 100 may have an embodiment that includes forming diode 110 as a P-N junction between substrate 102 and region 104. Those skilled in the art will appreciate that region 104 may have a topology of a circle or polygon when viewed in a plan view. Region 104 has an outer edge 105 that is distal from the midpoint of region 104. Another doped region 109 may be formed on substrate 102 to provide a low resistance contact to substrate 102. Some embodiments of region 109 may form a substantially ohmic contact to substrate 102. For example, region 109 may be heavily doped P-type material. In an embodiment, region 109 may completely surrounded the outer periphery of region 104 and spaced apart from region 104. Another doped region 106 may be formed in region 104 to provide a low resistance ohmic contact to region 104. In an embodiment, region 106 may be heavily doped N-type semiconductor material. Although region 106 is illustrated as a hollow circular region such as for example an annular-ring, region 106 may be formed as one solid region as illustrated by a dashed line 112. In an embodiment, the midpoint between the two portions of region 106 may be the midpoint of region 104.

Device 100 may have an embodiment where substrate 102 forms the anode of diode 110 and region 104 forms the cathode. In such an embodiment, region 109 forms an anode contact and a conductor 111 forms an anode electrode of diode 110. Similarly, region 106 forms a contact to the cathode of diode 110 and a conductor 107 forms a cathode electrode of diode 110. In some embodiments, substrate 102 may be configured to be connected to a common return potential such as the potential from terminal 132 or alternately to a common ground potential.

An insulator 113 typically is formed on the surface of substrate 102 to insulate region 104 and substrate 102 from other elements. Those skilled in the art will appreciate that insulator 113 may have one or more layers instead of the single layer illustrated in FIG. 2. Insulator 113 may be silicon dioxide or any other type of well-known insulator or combination of insulators that are used on semiconductor devices.

Resistor 117 is formed overlying insulator 113. In an embodiment, resistor 117 may be formed on insulator 113. Insulator 113 electrically isolates resistor 117 from a direct electrical connection to substrate 102. However, during operation with potentials applied there may be an electric field associated with resistor 117 that is coupled to portions of region 104. Resistor 117 is formed from a semiconductor material that provides a desired resistance value or alternately a desired sheet resistance. For example, resistor 117 may be formed from polysilicon, doped polysilicon, other well-known resistor materials, or other well-known semiconductor materials used to form resistors. The semiconductor material of resistor 117 may have an embodiment that has a substantially constant sheet resistance. Other embodiments may have a variation in the sheet resistance along at least a portion of the length of the semiconductor material. The semiconductor material may be patterned to provide an elongated shape and formed into a pattern of a spiral such that portions of resistor 117 are spaced laterally apart from each other forming a space between the portions. For example, the semiconductor material of resistor 117 may be formed on insulator 113 and patterned into the elongated shape including resistor portions 118 and 122 that are formed on insulator 113 and are adjacent to each other. Portions 118 may have an embodiment that may be an alternate embodiment of resistor element 138 and portions 122 may have an embodiment may be an alternate embodiment of resistor element 139. A contact 121 may be formed to electrically contact a portion of either element 118 or 122 to form signal output 136 that is illustrated in FIG. 1. The elongated shape has a starting point 119 at an inner portion of the elongated shape and an ending point 120 that is distal from starting point 119. For example, the starting point of resistor 117 may begin overlying a substantially interior portion of region 104. Those skilled in the art will appreciate that starting point 119 may not be the center of the spiral pattern. In an embodiment, the starting point of resistor 117 may be electrically connected to region 104 such as through a direct connection to either conductor 107 or to region 106. The ending point may have an embodiment that is not directly electrically connected to device 134. For example, not directly connected to region 104 and/or 109.

An insulator 116 may be formed on or overlying resistor 117 to insulate resistor 117 from other electrical elements.

Figure 3:
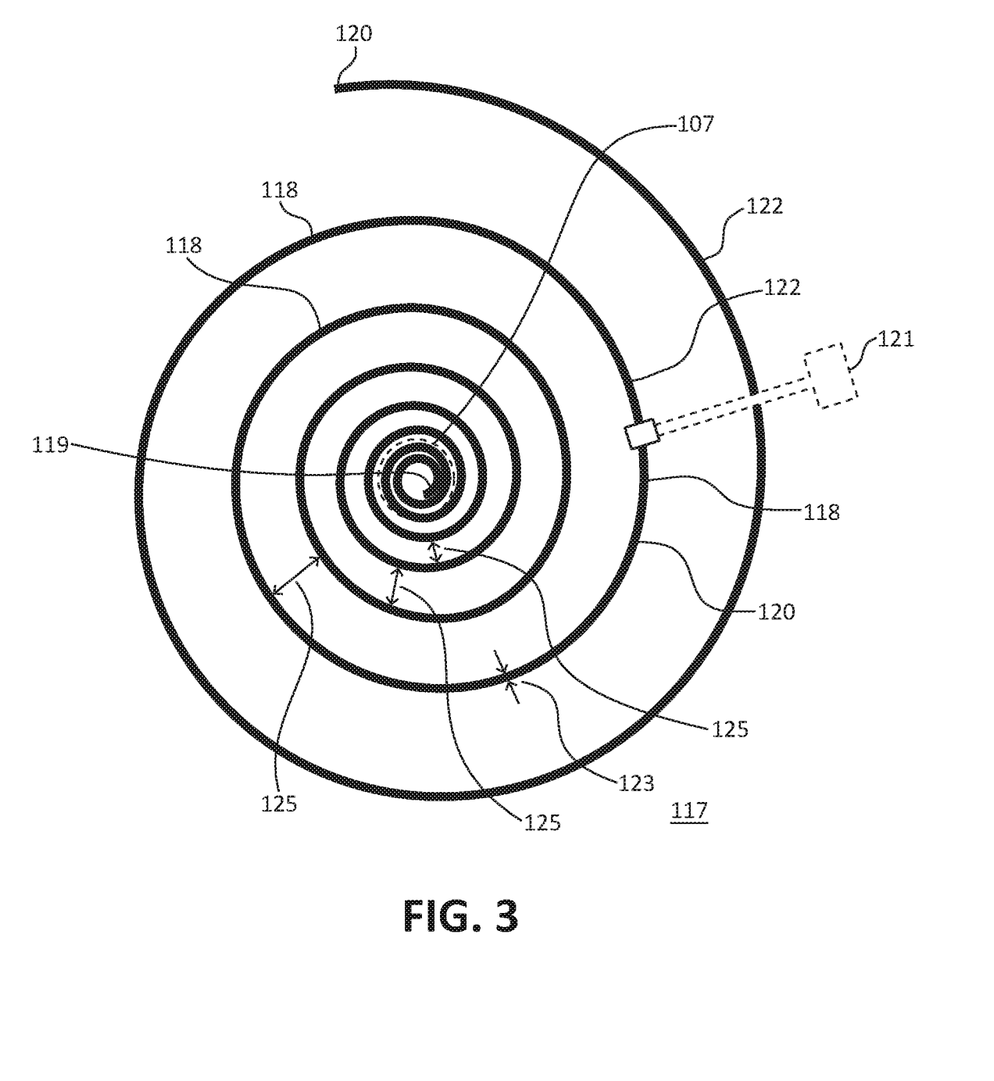
FIG. 3 graphically illustrates an enlarged portion of an example of an embodiment of a pattern for a portion of the device of FIGS. 1 and/or 2 in accordance with the present invention.

FIG. 3 graphically illustrates an enlarged portion of an example of an embodiment of a pattern for resistor 117. The spiral pattern formed by the semiconductor material of resistor 117 has elongated portions 118 and 122 illustrated as lines having a width 123 and spaced apart from each other by a distance or space 125. In an embodiment, width 123 is substantially constant along the semiconductor material. As will be seen hereinafter, width 123 may vary in other embodiments. An embodiment of space 125 is measured between the inside facing edges of two adjacent revolutions of resistor 117. For example, along a particular radian of the spiral that intersects the two adjacent revolutions. The elongated pattern means that any material used in the pattern is formed as a substantially continuous shape having a length that is greater than the width, such as for example a substantially continuous line. Even though the elongated material is formed into the spiral pattern, the semiconductor material still has an elongated shape and that elongated shape is coiled into the spiral pattern.

An embodiment of resistor 117 has a pattern that forms a substantially geometric spiral that has starting point 119 adjacent to conductor 107. In some embodiments, the spiral pattern may be a logarithmic spiral or other type of geometric spiral. The semiconductor material of resistor 117 and portions 118 and 122 extend in the elongated pattern from starting point 119 in a plurality of revolutions around a center of the spiral (near starting point 119) to form the spiral pattern. Adjacent portions of the revolutions are separated from each other by space 125. The spiral pattern is formed so that space 125 increases with distance along the periphery of the elongated shape. In an embodiment, space 125 may increase along the periphery beginning from starting point 119. In an embodiment, space 125 progressively increases until reaching the ending point of the elongated shape of the semiconductor material. An embodiment may include that space 125 increase proportionally to the distance from point 119. An embodiment may include that ending point 120 may be at the end of the semiconductor material. In other embodiments ending point 120 may be in other positions along the elongated pattern as illustrated by point 120 in two different places of FIG. 3.

Referring back to FIG. 2, it has been found that under reverse bias conditions, such as for example substrate 102 having a lower potential than region 104, region 104 may become substantially depleted of carriers and an electric field (illustrated in a general manner by an arrow 108) forms across region 104 with the highest potential being near region 106 and the lowest potential being near outer edge 105 of region 104. It has been found that forming space 125 to increase with increasing distance along the periphery forms a potential drop across resistor 117 that more closely matches the potential drop across the electric field illustrated by arrow 108. Forming these two potentials to more closely match improves the reverse breakdown characteristics of device 100. For example, provides a higher reverse breakdown voltage for a given surface area of device 100.

Figure 4:
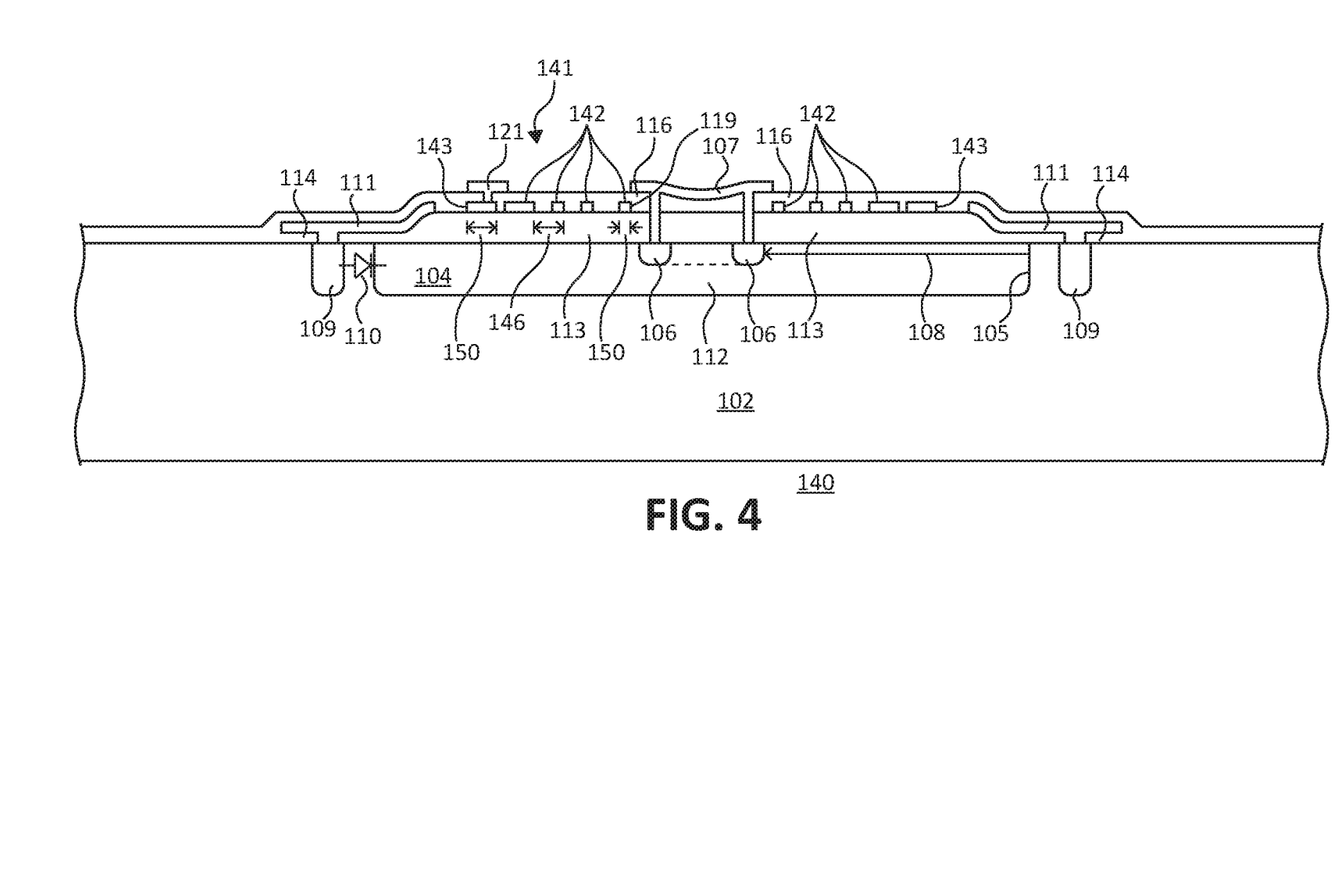
FIG. 4 illustrates an example of an enlarged cross-sectional portion of an embodiment of a semiconductor device that may be an alternate embodiment of the device of FIGS. 1 and/or 2 in accordance with the present invention.

FIG. 4 illustrates an example of an enlarged cross-sectional portion of an embodiment of a semiconductor device 140 that may have an embodiment that may be an alternate embodiment of device 134 (FIG. 1) or device 100 illustrated in FIG. 2. Device 140 includes a resistor 141 that may have an embodiment that may be an alternate embodiment of resistor 117 (FIG. 2). The semiconductor material used for forming resistor 141 may be formed on insulator 113 and patterned into the elongated shape including portions 142 and 143 that are formed along insulator 113 and are adjacent to each other. Portions 142 and 143 may have an embodiment that may be an alternate embodiment of respective portions 118 and 122 illustrated in FIG. 2. The type of semiconductor material used to form portions 142 and 143 is substantially the same type of material used for portions 118 and 122. Revolutions of portions 142 and 143 are spaced apart from each other by a space 146 instead of space 125 (FIG. 2). Space 146 is measured in substantially the same manner as space 125. However, space 146 of portions 142 and 143 has an embodiment that does not substantially change with distance along the periphery of resistor 141. However, a width 150 of each of portions 142 and 143 does increase with distance along the periphery of the elongated shape from starting point 119 to the ending point. In an embodiment, the ending point 120 may be at an end of the resistor material or may occur at a different point along the periphery of portions 142 or 143.

Figure 5:
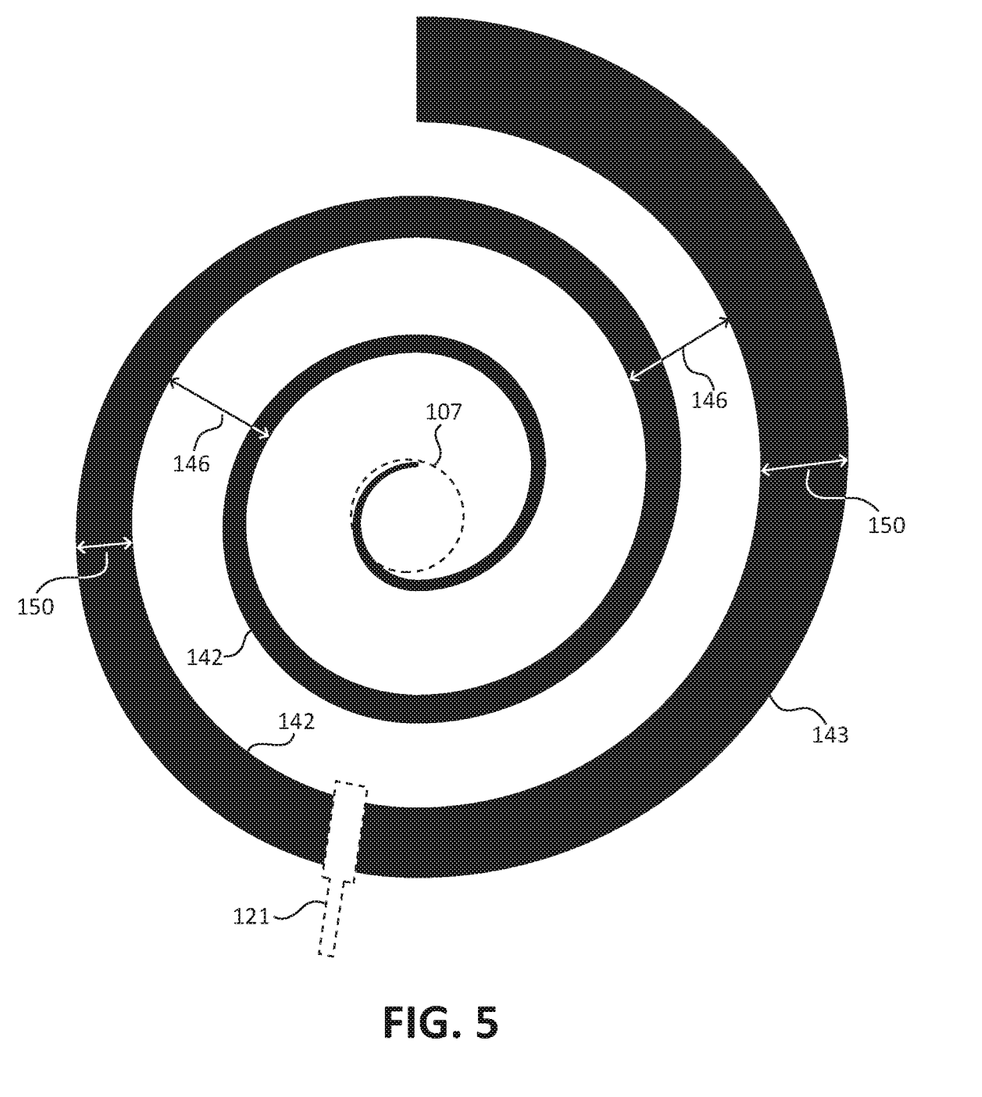
FIG. 5 graphically illustrates a portion of an enlarged example of an embodiment of a pattern for resistor for a portion of the device of FIG. 4 in accordance with the present invention.

FIG. 5 graphically illustrates a portion of an enlarged example of an embodiment of a pattern for resistor 141. Portions 142 and 143 are illustrated as lines having width 150 and spaced apart from each other by space 146. Width 150 is shown in an exaggerated ratio to the length for simplicity of the drawings.

Resistor 141 has a pattern that forms a substantially Archimedes spiral that has starting point 119 adjacent to conductor 107. The semiconductor material of resistor 141 extends in the elongated pattern from starting point 119 in a plurality of revolutions around the center of the spiral (near to starting point 119) to form the spiral pattern. Adjacent portions between revolutions are separated by space 146. In an embodiment, space 146 does not increase with distance along the periphery of the elongated shape. However, width 150 does increase with distance along the periphery of the elongated shape. In an embodiment, width 150 progressively increases until reaching an ending point of the elongated shape of the semiconductor material. An embodiment may include that ending point 120 may be at the end of the semiconductor material. In other embodiments the ending point may be in other positions along the elongated pattern. An embodiment of width 150 increases proportional to a ratio of the radius (from the center along a particular radian) between two different revolutions. As the ratio increases, width 150 also increases proportionally thereto. In another embodiment, width 150 may increase proportionally to distance along the perimeter from point 119.

It has been found that forming width 150 to vary with increasing distance along the periphery, also assists in more closely matching the reverse bias potential drop across the electric field illustrated by arrow 108 thereby improving the reverse breakdown characteristics of device 140.

Figure 6:
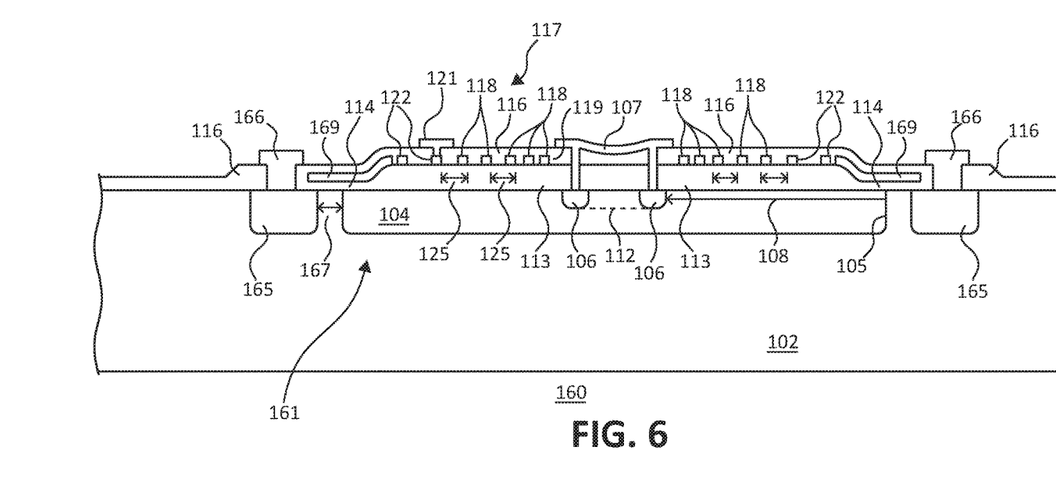
FIG. 6 illustrates an example of an enlarged cross-sectional portion of an embodiment of a semiconductor device that may be an alternate embodiment of the device of FIGS. 1 and/or 2 and/or 4 in accordance with the present invention.

FIG. 6 illustrates an example of an enlarged cross-sectional portion of an embodiment of a semiconductor device 160 that may have an embodiment that may be an alternate embodiment of device 134 (FIG. 1) or device 100 illustrated in FIG. 2 or device 140 (FIG. 4). Device 160 includes a transistor 161 that may have an embodiment that may be an alternate embodiment of the transistor illustrated in FIG. 1. Device 160 also includes resistor 117. An alternate embodiment of device 160 may include resistor 141 instead of resistor 117.

Region 104 may form a drain of transistor 161 and region 106 now forms a contact to the drain of transistor 161. Conductor 107 now forms a drain electrode of transistor 161. A doped region 165 may be formed in substrate 102 and spaced apart from region 104. An embodiment of region 165 may form a source region for transistor 161, thus, region 165 may be doped with the same conductivity type as region 104. A source electrode or conductor 166 may be formed on region 165 to provide an electrical connection to region 165. A gate electrode or gate conductor 169 may be formed overlying a portion of substrate 102 between regions 104 and 165 to form a channel region 167 for transistor 161.

During operation device 160 may have periods where device 160 is disabled and has to withstand a voltage drop from near region 106, such as for example at a point of the region at dashed line 112, across region 104 to edge 105 resulting in an electric field illustrated by arrow 108. It has been found that forming resistor 117 with space 125 also forms a potential drop across resistor 117 that more closely matches the potential drop across the electric field. Forming these two potentials to more closely match improves the reverse breakdown characteristics of device 160. For example, provides a higher reverse breakdown voltage for a given surface area of device 160.

In some embodiments, device 160 may include a JFET instead of transistor 161. For such an embodiment, substrate 102 may form the gate electrode of the JFET. Region 165 and conductor 169 (along with a portion of region 104 near edge 105) may form an additionally MOSFET transistor that is connected in series with the JFET. Resistor 117 still provides the same advantages as explained for transistor 161.

Figure 7:
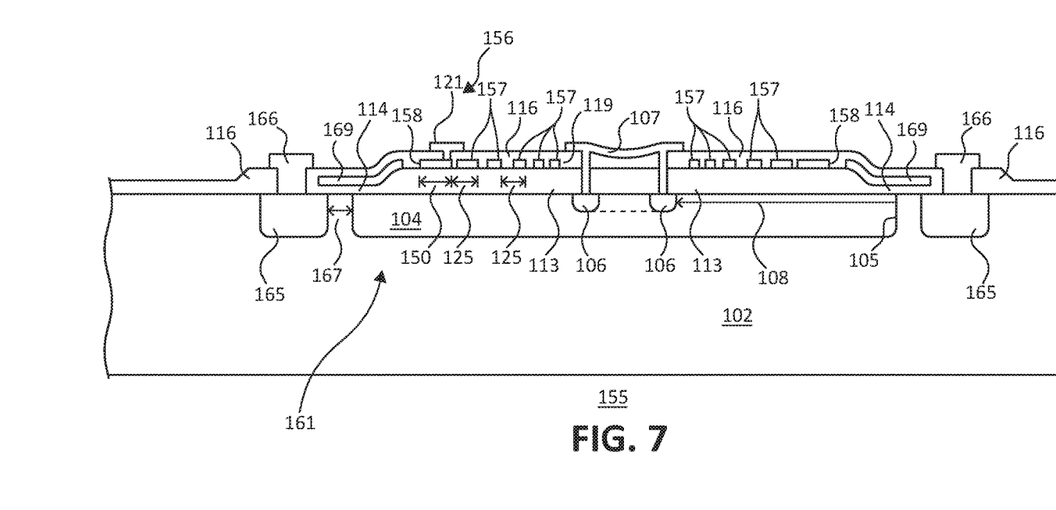
FIG. 7 illustrates an example of a cross-sectional portion of an example of an embodiment of a semiconductor device that may be an alternate embodiment of the device of FIGS. 1 and/or 2 and/or 4 and/or 6 in accordance with the present invention.

FIG. 7 illustrates an example of a cross-sectional portion of an example of an embodiment of a semiconductor device 155 that may have an embodiment that may be an alternate embodiment of device 134 (FIG. 1) or device 100 illustrated in FIG. 2 or device 140 (FIG. 4) or device 160 (FIG. 6). Device 155 includes transistor 161 and also includes a resistor 156 and portions 157 and 158. Resistor 156 is formed from substantially the same type of semiconductor material as resistor 117. Resistor 156 has a pattern that forms a substantially Archimedes spiral with starting point 119 adjacent to conductor 107. In some embodiments, starting point 119 is directly connected to region 106 or alternately conductor 107. The semiconductor material of resistor 156 extends in the elongated pattern from starting point 119 in a plurality of revolutions around the center of the spiral pattern. Adjacent portions 157 and 158 between revolutions are separated by space 125 and also have width 150. Thus, space 125 and also width 150 both vary with distance along the periphery of the elongated shape as is explained herein before.

Figure 8:
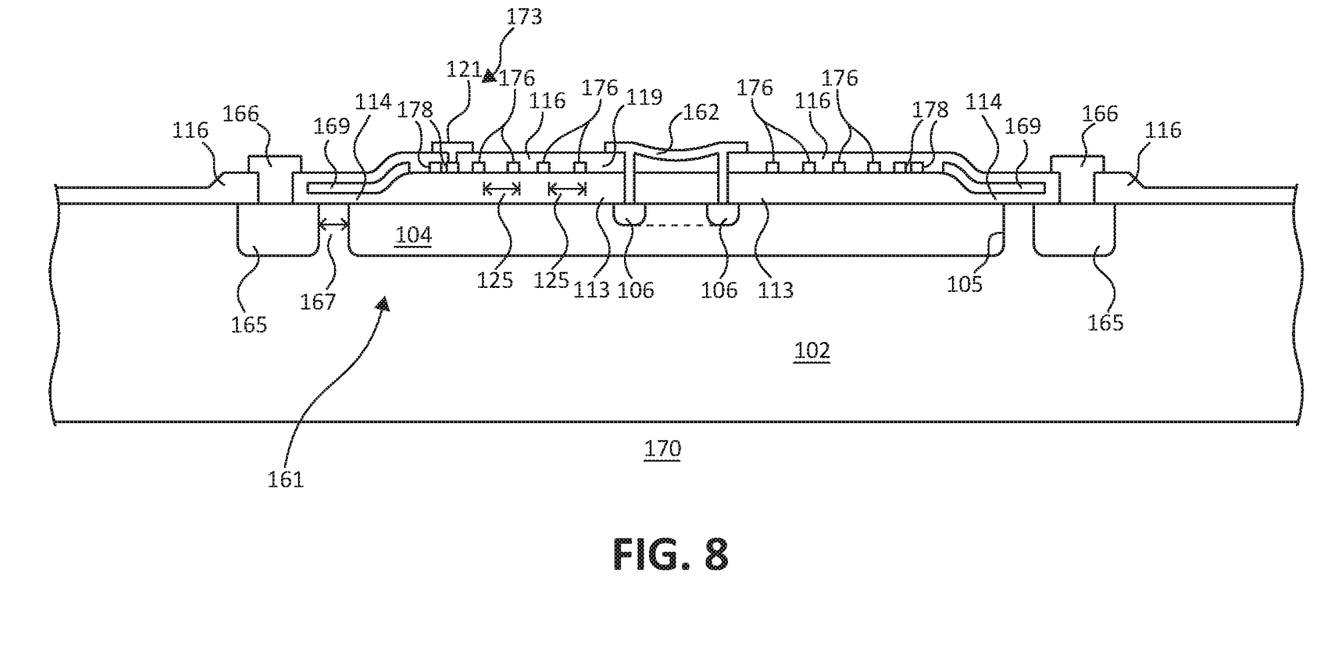
FIG. 8 illustrates an enlarged example of a cross-sectional portion of an embodiment of a semiconductor device that may be an alternate embodiment of the device of FIGS. 1 and/or 2 and/or 4 and/or 6 and/or 7 in accordance with the present invention.

FIG. 8 illustrates an enlarged example of a cross-sectional portion of an embodiment of a semiconductor device 170 that may have an embodiment that may be an alternate embodiment of device 134 (FIG. 1) or device 100 (FIG. 2) or device 140 (FIG. 4) or device 160 (FIG. 6) or device 155 (FIG. 7). Device 170 includes transistor 161 and also includes a resistor 173 that may have an embodiment that may be an alternate embodiment of resistor 129 (FIG. 1).

Resistor 173 includes portions 176 and 178 that may have an embodiment that is an alternate embodiment of portions 118 and 122. Resistor 173 is formed from substantially the same type of semiconductor material as resistor 117. Portions 176 and 178 include space 179 that decreases with distance along the periphery of the elongated shape beginning from starting point 119 or alternately increases with distance from the ending point along the periphery of the elongated shape to starting point 119.

Devices without a space that varies like space 179 may develop hot spots in the semiconductor material such as for example in region 104 or substrate 102 near region 106. During operation the device may have periods where the device is disabled and has to withstand a voltage drop from near or adjacent to region 106 across region 104 to edge 105. It is believed that such devices without space 179 have a high electric field near and in the vicinity of starting point 119 because without space 179 there may be a larger density per area of resistor material near starting point 119 than near the ending point. It has been found that forming resistor 173 with space 179 reduces the temperature near starting point 119 and spreads the heat more evenly across region 104. It has been found that having the hotter area close to starting point 119 can increase the on-resistance of the device. Thus, space 179 reduces the heat generated near starting point 119 and improves the on-resistance and the performance of device 170.

Figure 9:
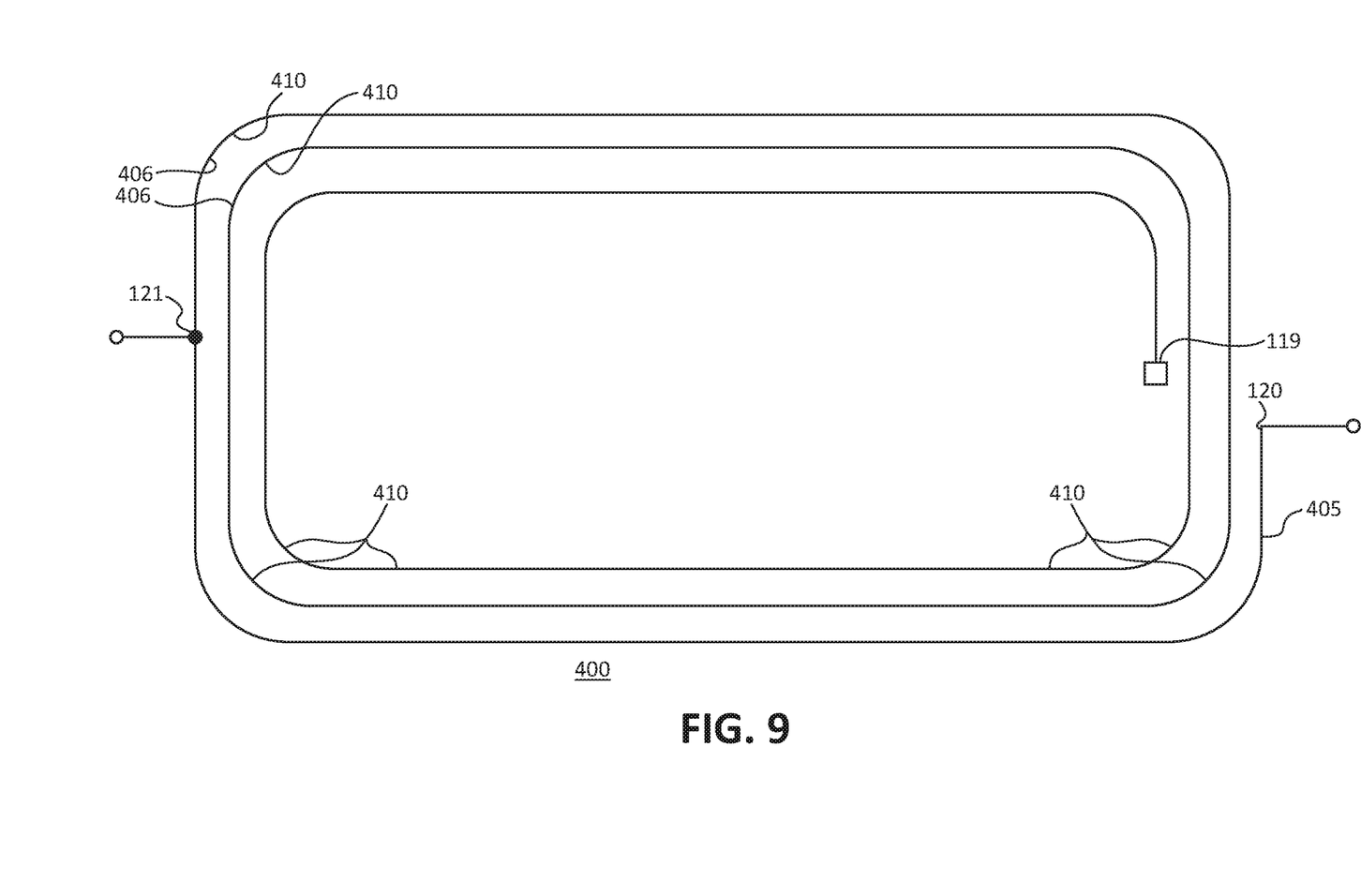
FIG. 9 graphically illustrates a portion of an enlarged example of an embodiment of a pattern 400 that may be an alternate embodiment of the patterns of FIGS. 3 and 5 in accordance with the present invention.

FIG. 9 graphically illustrates a portion of an enlarged example of an embodiment of a pattern 400 that may be used for resistor 117 or 141. Pattern 400 may have an embodiment that may be an alternate embodiment of the patterns of FIGS. 3 and 5. Pattern 400 has a shape of a polygon having substantially curved corners 406. Portions 405 and 410 may have embodiments that may be alternate embodiments of portions 122 and 120 respectively, or portions 142 and 143, respectively.

From all the foregoing, one skilled in the art will understand that an example of an embodiment of a semiconductor device having a high voltage resistor element may comprise:

a semiconductor substrate, such as for example substrate 102, having a first conductivity type;

a first doped region, such as for example region 104, of a second conductivity type on a first portion of the semiconductor substrate wherein the first doped region forms either a drift region of a transistor or portion of a P-N junction of a diode;

a second doped region such as for example region 109 or 165, of the second conductivity type in the semiconductor substrate and spaced apart from the first doped region wherein the second doped region forms either another region of the transistor or a contact region for the diode;

an insulator, such as for example insulator 113, overlying the first doped region; and a resistor, such as for example resistor 117, overlying the insulator, the resistor formed from a semiconductor material formed in an elongated shape with portions that are spaced laterally apart from each other to form a space, such as for example space 125, between the portions so that the elongated shape forms a spiral wherein the space increases with distance along a periphery of the elongated shape from a starting point, such as for example point 119, to an ending point, such as for example point 120, of the elongated shape, wherein the starting point is at an inner portion of the elongated shape and the ending point is at an opposite end of the elongated shape.

An embodiment may include that the spiral may be a substantially circular Archimedes spiral or a substantially circular geometric spiral.

In an embodiment, the spiral may be a polygonal spiral having curved corners that form substantially an arc shape.

An embodiment of the semiconductor device may include that the first doped region may include the drift region of a JFET transistor or the drift region of an MOS transistor.

An embodiment may include that the portions may have a width and the width increases with distance along the periphery from the starting point to the ending point.

Those skilled in the art will also appreciate that a method of forming a resistor of a semiconductor device may comprise:

providing a semiconductor substrate having a first conductivity type;

forming a first doped region of a second conductivity type on a first portion of the semiconductor substrate;

forming a second doped region of the second conductivity type in the semiconductor substrate and spaced apart from the first doped region;

forming an insulator overlying the first doped region;

forming a resistor overlying the insulator and the first doped region including forming a resistor material as an elongated element that is formed in a pattern of either a substantially circular spiral or a substantially polygonal spiral having curved corners having an arc shape, the pattern extending from a starting point at an interior of the pattern in a plurality of revolutions that increase in distance from the starting point to an ending point, including forming the resistor material to have one of a separation distance between adjacent revolutions that increases with distance along a periphery of the resistor material or a width of the resistor material that increases with distance along the periphery of the resistor material.

An embodiment of the method may include forming the starting point electrically coupled to the first doped region.

Another embodiment may include forming the resistor with the separation distance that increases with increasing distance along the periphery from the starting point to the ending point.

An embodiment may include forming the resistor with the width that increases with increasing distance along the periphery from the starting point to the ending point.

In an embodiment, the method may include forming the resistor with the separation distance that increases with increasing distance along the periphery from the ending point to the starting point.

Another embodiment of the method may include forming the resistor with both the separation distance that increases with increasing distance along the periphery from the starting point to the ending point and also with the width that increases along the periphery from the starting point to the ending point.

The method may have an embodiment that may include forming the second doped region as a source region of a transistor.

An embodiment may also include forming a portion of the first doped region as a source region of a JFET.

Another embodiment may also include forming the separation distance between inside edges of adjacent revolutions wherein the inside edges face toward the starting point.

An embodiment of the method may include forming the substantially polygonal spiral as one of a rectangular spiral having the curved corners, a pentagon spiral having the curved corners, or a hexagon spiral having the curved corners.

Another embodiment may include forming the resistor material to include polysilicon.

Those skilled in the art will also appreciate that a method of forming a resistor of a semiconductor device may comprise:

providing a semiconductor substrate having a first conductivity type;

forming a first doped region of a second conductivity type on a first portion of the semiconductor substrate;

forming an insulator overlying the first doped region; and forming a resistor overlying the insulator and the first doped region including forming a resistor material as an elongated element that is formed in a pattern of a spiral, the pattern extending from a starting point at an interior of the pattern in a plurality of revolutions from the starting point to an ending point, including forming the resistor material to have one of a separation distance between adjacent revolutions that increases with distance along a periphery of the resistor material or a width of the resistor material that increases with distance along the periphery of the resistor material.

An embodiment may also include forming the pattern as either a substantially circular spiral or a substantially polygonal spiral having curved corners having an arc shape.

The method may have an embodiment that may include forming the pattern to overlie the first doped region.

Another embodiment may include forming the separation distance to decrease with distance along the periphery from the starting point to the ending point.

Those skilled in the art will also appreciate that a resistor of a semiconductor device may comprise:

a semiconductor substrate having a first conductivity type;

a first doped region of a second conductivity type formed on a first portion of the semiconductor substrate;

a second doped region of the second conductivity type formed in the semiconductor substrate and spaced apart from the first doped region;

an insulator overlying the first doped region;

a resistor overlying the insulator and the first doped region, the resistor including a resistor material as an elongated element that is formed in a pattern of either a substantially circular spiral or a substantially polygonal spiral having curved corners having an arc shape, the pattern extending from a starting point at an interior of the pattern in a plurality of revolutions that increase in distance from the starting point to an ending point, including forming the resistor material to have one of a separation distance between adjacent revolutions that increases with distance along a periphery of the resistor material or a width of the resistor material that increases with distance along the periphery of the resistor material.

Another embodiment may include that the separation distance increases with increasing distance along the periphery from the starting point to the ending point.

Another embodiment may also include that the separation distance may be disposed between inside edges of adjacent revolutions wherein the inside edges face toward the starting point.

An embodiment may include that the substantially polygonal spiral may be one of a rectangular spiral having the curved corners, a pentagon spiral having the curved corners, or a hexagon spiral having the curved corners.

Those skilled in the art will also appreciate that a resistor of a semiconductor device may comprise:

a semiconductor substrate having a first conductivity type;
a first doped region of a second conductivity type on a first portion of the semiconductor substrate;
an insulator overlying the first doped region; and
a resistor overlying the insulator and the first doped region, the resistor including a resistor material formed as an elongated element that is formed in a pattern of a spiral, the pattern extending from a starting point at an interior of the pattern in a plurality of revolutions from the starting point to an ending point, the resistor material having one of a separation distance between adjacent revolutions that increases with distance along a periphery of the resistor material or a width of the resistor material that increases with distance along the periphery of the resistor material.

An embodiment may also include that the pattern may include either a substantially circular spiral or a substantially polygonal spiral having curved corners having an arc shape.

Another embodiment may include that the separation distance decreases with distance along the periphery from the starting point to the ending point.

In view of all of the preceding, it is evident that a novel device and method is disclosed. Included, among other features, is forming a resistor in a pattern that forms an electric field that is substantially similar to an electric field in an underlying semiconductor region of the device. The resistor may be formed in a spiral pattern that has an increasing space between successive revolutions wherein the space increases with distance along a perimeter of the material of the spiral pattern. Alternately, a width of the material may increase instead of the space or alternately in addition to the space.

The varying space or varying width assists in forming an electric field that more closely matches the electric field in the underlying semiconductor device.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. Although the spiral pattern of resistors 117 and 141 are illustrated as revolving in a counter-clockwise direction, those skilled in the art will understand that the rotations or revolutions may alternately revolve in a clockwise direction. The advantages resulting from the herein descriptions are obtained regardless of whether the revolutions are in a clockwise or counter-clockwise direction.)

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a resistor of a semiconductor device comprising:
providing a semiconductor substrate having a first conductivity type;
forming a first doped region of a second conductivity type on a first portion of the semiconductor substrate;
forming a second doped region of the second conductivity type in the semiconductor substrate and spaced apart from the first doped region;
forming an insulator overlying the first doped region;
forming a resistor overlying the insulator and the first doped region including forming a resistor material as an elongated element that is formed in a pattern of either a substantially circular spiral or a substantially polygonal spiral having curved corners having an arc shape, the pattern extending from a first point at an interior of the pattern in a plurality of revolutions that increase in distance from the first point to an ending point, including forming the resistor material to have a width of the resistor material that increases with distance along a path of the resistor material, and a separation distance between adjacent revolutions that increases with increasing distance along the path.

2. The method of claim 1 including forming the first point electrically coupled to the first doped region.

3. The method of claim 1 further including forming the second doped region as a source region of a transistor.

4. The method of claim 1 further including forming a portion of the first doped region as a source region of a junction field effect transistor.

5. The method of claim 1 further including forming the separation distance between inside edges of adjacent revolutions wherein the inside edges face toward the starting point.

6. The method of claim 1 further including forming the substantially polygonal spiral as one of a rectangular spiral having the curved corners, a pentagon spiral having the curved corners, or a hexagon spiral having the curved corners.

7. The method of claim 1 further including forming the resistor material to include polysilicon.

8. A method of forming a resistor of a semiconductor device comprising:
providing a semiconductor substrate having a first conductivity type;
forming a first doped region of a second conductivity type on a first portion of the semiconductor substrate;
forming a second doped region of the second conductivity type in the semiconductor substrate and spaced apart from the first doped region;
forming an insulator overlying the first doped region;
forming a resistor overlying the insulator and the first doped region including forming a resistor material as an elongated element that is formed in a pattern of either a substantially circular spiral or a substantially polygonal spiral having curved corners having an arc shape, the pattern extending from a first point at an interior of the pattern in a plurality of revolutions that increase in distance from the first point to an ending point, including forming the resistor material to have a separation distance between adjacent revolutions that increases with distance substantially along an entire path of the resistor material from the ending point to the first point.

9. A method of forming a resistor of a semiconductor device comprising:
providing a semiconductor substrate having a first conductivity type;
forming a first doped region of a second conductivity type on a first portion of the semiconductor substrate;
forming an insulator overlying the first doped region; and
forming a resistor overlying the insulator and the first doped region including forming a resistor material as an elongated element that is formed in a pattern of a spiral, the pattern extending from a first point at an interior of the pattern in a plurality of revolutions from the first point to an ending point, including forming the resistor material to have a separation distance between adjacent revolutions that increases with distance substantially along an entire path of the resistor material from the ending point to the first point.

10. The method of claim 9 including forming the pattern as either a substantially circular spiral or a substantially polygonal spiral having curved corners having an arc shape.

11. The method of claim 9 including forming the pattern to overlie the first doped region.

* * * * *